(12) United States Patent
Siferd

(10) Patent No.: US 6,518,905 B2
(45) Date of Patent: Feb. 11, 2003

(54) PARALLEL TIME INTERLEAVED DELTA SIGMA MODULATOR

(75) Inventor: Raymond E. Siferd, Beavercreek, OH (US)

(73) Assignee: Wright State University, Dayton, OH (US)

(*) Notice: Subject to any disclaimer, the term of this patent is extended or adjusted under 35 U.S.C. 154(b) by 0 days.

(21) Appl. No.: 10/005,089

(22) Filed: Dec. 5, 2001

(65) Prior Publication Data

US 2002/0118128 A1 Aug. 29, 2002

Related U.S. Application Data

(60) Provisional application No. 60/257,614, filed on Dec. 21, 2000.

(51) Int. Cl.[7] .............................................. H03M 3/00
(52) U.S. Cl. ........................................ 341/143; 341/155
(58) Field of Search ........................... 341/155, 81, 143

(56) References Cited

U.S. PATENT DOCUMENTS

| | | | |
|---|---|---|---|
| 5,392,042 A | 2/1995 | Pellon | |
| 5,406,283 A | 4/1995 | Leung | |
| 5,598,159 A | 1/1997 | Hein | |
| 5,621,408 A | * 4/1997 | Cake | ........................ 341/143 |
| 5,646,621 A | 7/1997 | Cabler et al. | |
| 5,682,161 A | 10/1997 | Ribner et al. | |
| 5,734,683 A | 3/1998 | Hulkko et al. | |
| 5,757,300 A | 5/1998 | Koilpillai et al. | |
| 5,907,299 A | 5/1999 | Green et al. | |
| 5,595,031 A | 11/1999 | Okuda et al. | |
| 6,034,629 A | 3/2000 | Heo et al. | |
| 6,061,008 A | 5/2000 | Abbey | |
| 6,107,947 A | 8/2000 | Lyden | |
| 6,188,345 B1 | 2/2001 | McDonald et al. | |
| 6,271,782 B1 | 8/2001 | Steensgaard-Madsen | |
| 6,292,121 B1 | 9/2001 | Cake et al. | |

* cited by examiner

*Primary Examiner*—Brian Young
(74) *Attorney, Agent, or Firm*—Killworth, Gottman, Hagan & Schaeff LLP

(57) ABSTRACT

A bandpass analog to digital converter includes M single channel delta sigma modulators having N-bit quantizer outputs arranged in a parallel configuration and operated at a predetermined sample frequency ($f_s$). The modulator outputs are time interleaved and digitally combined in a manner that provides performance characteristics comparable to a modulator with a sample frequency of $Mf_s$. Thus, bandpass center frequencies that are much higher than conventional single channel architectures are achievable. Single channel first order modulator bandpass center frequencies are restricted to $f_c=f_s/4$. However, a range of center frequencies approaching $Mf_s/2$ is supported. This increased frequency capability is obtained while maintaining the delta sigma noise shaping near the higher bandpass center frequencies to reduce the effects of quantization noise. This results in a high signal to noise ratio with a corresponding high resolution at the much higher center frequencies.

26 Claims, 4 Drawing Sheets

PARALLEL TIME INTERLEAVED DELTA SIGMA MODULATOR

CROSS REFERENCE TO RELATED APPLICATIONS

This application claims the benefit of U.S. Provisional Application No. 60/257,614 filed Dec. 21, 2000, which is incorporated herein by reference.

STATEMENT REGARDING FEDERALLY SPONSORED RESEARCH OR DEVELOPMENT

The present invention was made with Government support under contract F33615-00-C-1638 awarded by the Department of Defense. The Government has certain rights in the invention.

BACKGROUND OF THE INVENTION

The present invention relates in general to analog to digital converters, and in is particular to analog to digital converters comprising a parallel, time-interleaved delta sigma modulator architecture.

Digital circuitry has become increasingly prevalent in a wide variety of electronic devices including telecommunications, audio, video, portable/mobile communication transmitters and receivers, and other consumer products. One reason for the popularity of digital circuitry is that digital signal processing can be used to replace large numbers of analog components. Eliminating analog components from a device can lead to a reduction in the size, weight, and power requirements, while increasing flexibility and reliability of the device.

Analog-to-digital converters (ADCS) provide a link between the analog and digital domains. The ADC must be capable of converting analog data to digital data in an accurate manner, appropriate to the bandwidth and resolution needs of a given application. One type of ADC that is commonly used for analog to digital conversion is the oversampling ADC based on delta sigma ($\Delta\Sigma$) modulation. Oversampling ADCs are used in applications requiring high-resolution analog to digital conversion because this approach permits high resolution without the need for extremely tight tolerances for analog components. $\Delta\Sigma$ modulation may be implemented using a mix of analog and digital circuitry, and is comprised generally of an input sampler, a filter, a quantizer, and a feedback path to sum the quantizer output back into the input to the filter. The quantizer output signal also defines the $\Delta\Sigma$ modulator output signal. A clock signal supplied to the $\Delta\Sigma$ modulator determines the sampling frequency, or the frequency at which the modulator output is updated.

Oversampling ADCs use an oversampling ratio (OSR) that is the ratio of the sampling frequency of the $\Delta\Sigma$ modulator to twice the bandwidth (Nyquist Frequency) of the input signal. The oversampling ratio is typically greater than one, and is often twenty-five or more. For conventional first order $\Delta\Sigma$ modulators, the signal to quantization noise (S/N) ratio increases by approximately 9db (1.5 bits) for each doubling of the OSR. Thus, better resolution is achieved by implementing a higher OSR, that is, by using a sampling frequency that is much higher than the Nyquist Frequency. However, circuit components that operate at higher frequencies are difficult to realize and if realizable, cost more than those that operate at lower frequencies.

For example, when designing mixed signal circuits based upon clocked systems, the maximum clock frequency is usually determined by the slowest component in the system. In $\Delta\Sigma$ modulation circuits, it is usually the settling of the key analog component of the modulator that takes the longest time, and thus the bandwidth of an analog signal converted to digital information by a delta sigma modulator is limited by the maximum achievable clocking rate of the modulator.

Accordingly, despite the advantages of $\Delta\Sigma$ modulation ADC circuits, the need to oversample the input signal by the modulator renders $\Delta\Sigma$ modulation impractical for certain higher frequency applications. Many applications require a bandpass ADC, where the analog input signal frequency is centered at a high frequency and confined to some bandwidth. For example, the trend in modern receiver design is to move the analog-to-digital interface as close as possible to the antenna or sensor. Having the analog-to-digital conversion closer to the antenna in the signal path (higher frequency) eliminates multiple stages of down conversion to lower frequencies and the associated components such as analog filtering. However, moving the analog to digital interface to higher frequencies requires bandpass ADCs with high center frequencies and good resolution. The center frequencies may range from hundreds of Megahertz to tens of Gigahertz with bandwidths that are relatively small compared to the center frequencies.

Accordingly, there is a need for bandpass $\Delta\Sigma$ modulation analog to digital conversion circuits that are capable of converting analog signals having very high center frequencies and having high resolution within a given bandwidth.

SUMMARY OF THE INVENTION

The present invention overcomes the disadvantages of previously known delta sigma analog to digital converters by providing a time-interleaved delta sigma modulator architecture that allows the conversion of relatively high frequency signals with a relatively low sample frequency.

In accordance with one embodiment of the present invention, a bandpass time interleaved delta sigma modulator analog to digital conversion architecture comprises an analog input signal that is coupled in parallel, to a plurality of modulators. The output of each modulator is coupled to a respective input of a multiplexer, and the multiplexer output is coupled to a bandpass filter and decimation circuitry to provide the analog to digital conversion circuit output. Each modulator is clocked by a signal that operates at a predetermined sample frequency, and is time phase shifted such that each modulator samples the analog input signal in a time-interleaved manner. Also, the multiplexer includes an input control that is synchronized with the various time-interleaved clock signals such that the output of the multiplexer is updated to reflect the output of each of the plurality of modulators once per cycle of the sample frequency.

For example, M single channel delta sigma modulators having N-bit quantizer outputs are arranged in a parallel configuration and operated at a predetermined sample frequency ($f_s$). The modulator outputs are time interleaved and digitally combined in a manner that provides performance characteristics comparable to a modulator with a sample frequency of $Mf_s$. Thus, bandpass center frequencies that are much higher than conventional single channel architectures are achievable. Typical single channel first order modulator bandpass center frequencies are restricted to $f_c=f_s/4$. However, the present invention supports a range of center frequencies approaching $Mf_s/2$. This increased frequency capability is obtained while maintaining the delta sigma noise shaping near the higher bandpass center frequencies to reduce the effects of quantization noise. This results in a high signal to noise ratio with a corresponding high resolution at the much higher center frequencies.

Accordingly, it is an object of the present invention to provide a delta sigma modulator analog to digital converter architecture that allows the conversion of relatively high frequency signals with a relatively low sample frequency clock.

It is an object of the present invention to provide a bandpass delta sigma modulator analog to digital conversion architecture that can convert signals having an increased center frequency over single delta sigma modulator architectures.

Other objects of the present invention will be apparent in light of the description of the invention embodied herein.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals, and in which.

DETAILED DESCRIPTION OF THE PREFERRED EMBODIMENTS

In the following detailed description of the preferred embodiments, reference is made to the accompanying drawings that form a part hereof, and in which is shown by way of illustration, and not by way of limitation, specific preferred embodiments in which the invention may be practiced. It is to be understood that other embodiments may be utilized and that logical and electrical changes may be made without departing from the spirit and scope of the present invention.

Bandpass Parallel Time Interleaved ΔΣ Modulator ADC

Figure 1:
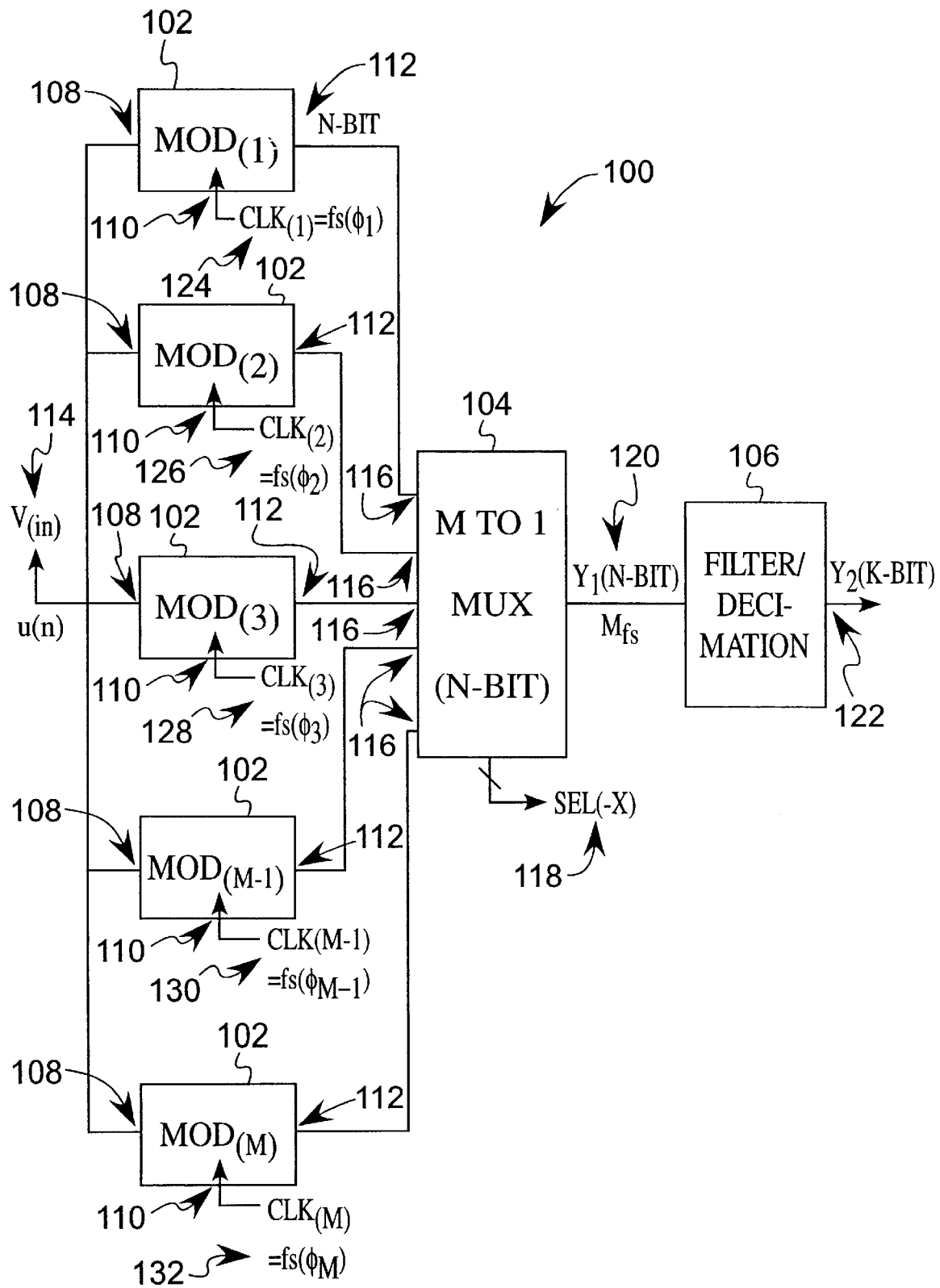
FIG. 1 is a schematic illustration of a time-interleaved analog to digital converter according to one embodiment of the present invention.

Referring to FIG. 1, a parallel time interleaved ΔΣ modulator ADC circuit 100 according to one embodiment of the present invention comprises a plurality of modulators 102, a multiplexer 104, and a filter or other processing circuitry 106. Each modulator 102 comprises a modulator input 108, a clock input 110, and a modulator output 112. An analog input signal u(n) 114, an input voltage $V_{in}$ as illustrated, is coupled in parallel to each modulator input 108. Each modulator 102 is configured to produce an N-bit digital output where N is the number of quantization bits of the modulator outputs 112.

The multiplexer 104 comprises a plurality of multiplexer inputs 116, a multiplexer input control 118, and a multiplexer output 120. Each modulator output 112 is coupled to a respective one of the multiplexer inputs 116. The multiplexer input control 118 is configured to select between the various N-bit modulator outputs 112 such that at any given time, the multiplexer output 120 comprises a select one of the modulator outputs 112. Accordingly, the multiplexer output 120 also comprises a digital N-bit word. The multiplexer output 120, or first output signal ($Y_1$), is coupled to additional digital processing circuitry 106 as the application dictates. For example, processing circuitry 106 may comprise a filter and decimation circuit. Under this arrangement, the first output signal ($Y_1$) or multiplexer output 120 is coupled to a filter that implements a lowpass or bandpass filtering function. The signal then couples to a decimation circuit to produce a second output signal ($Y_2$), also referred to herein as the ADC output 122. The ADC output 122 comprises a multi-bit digital word output. The number of bits (K) in the ADC output 122 will depend upon the application in which the parallel time interleaved ΔΣ modulator ADC circuit 100 is being used.

As shown in FIG. 1, there are a total of M modulators 102. Each modulator 102 defines a channel of the parallel time interleaved ΔΣ modulator ADC circuit 100, and comprises a first order, or higher order ΔΣ modulator. The number of ΔΣ modulators 102 employed, the type and order of each ΔΣ modulator 102, and the number of quantization bits of each ΔΣ modulator output 112 will depend upon the sampling requirements of the application to which the parallel time interleaved ΔΣ modulator ADC circuit 100 is being used.

Each ΔΣ modulator clock input 110 is arranged to receive a clock signal 124–132 that operates at a predetermined sample frequency $f_s$. Each ΔΣ modulator 102 samples the analog input signal 114 once every cycle of the sample frequency $f_s$. However, each clock signal 124–132 applied to an associated one of each ΔΣ modulators 102 is time phase shifted such that each ΔΣ modulator 102 samples the analog input signal 114 at a different time, or in a time-interleaved fashion. Preferably, each ΔΣ modulator output 112 is updated in a time-phased manner that corresponds to the sampling of the input signal 114 at the corresponding ΔΣ modulator input 108. Accordingly, the ΔΣ modulator outputs 112 are also updated in a time-interleaved fashion.

Figure 2:
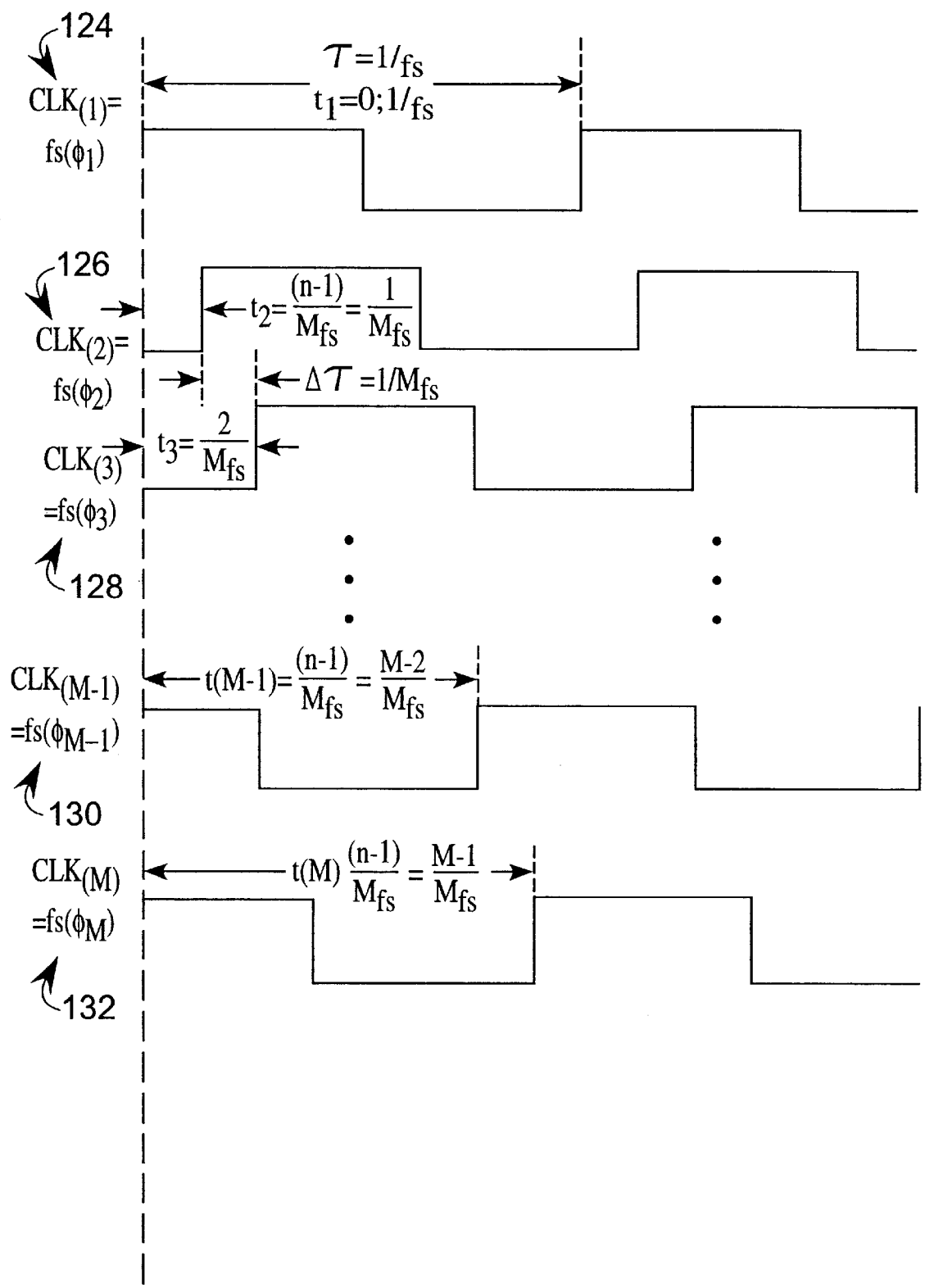
FIG. 2 is an illustration of a timing diagram according to one aspect of the present invention where M total modulators are implemented in a parallel time interleaved fashion.

A timing diagram illustrating the time phase relationship between clock signals 124–132 supplied to the ΔΣ modulator clock inputs 110 is illustrated in FIG. 2. There are M distinct clock signals 124–132, each clock signal having a period of $$\tau = \frac{1}{f_s}$$

where $f_s$ is the sampling frequency. As illustrated, the rising edge of the first one of the clock signals $CLK_{(1)}$ 124 occurs at time t=0. Each successive clock signal $CLK_{(2)}$-$CLK_{(M)}$ 126–132 is time phased shifted by an amount defined by the equation, $$\Delta t = \frac{1}{Mf_s}.$$

Accordingly, each ΔΣ modulator receives an associated one of the clock signals 124–132 that operates at a frequency that is equal to the sampling frequency $f_s$, and time phased an amount equal to $$t_m = \frac{(m-1)}{Mf_s}$$

where m is the $m^{th}$ ΔΣ modulator of M total ΔΣ modulators.

Referring back to FIG. 1, according to one aspect of the present invention, the analog input signal 114 comprises an input voltage $V_{in}$. Thus, each sample taken at a select one of the ΔΣ modulator inputs 108 is expressed as $$V_m = V_{in}\left(t - \frac{m-1}{Mf_s}\right).$$

Because each ΔΣ modulator 102 samples at the sample frequency $f_s$ and is time shifted such that the input signal 114 is sampled in a time-interleaved manner, the analog input signal 114 is effectively sampled at a rate of $Mf_s$ for M total ΔΣ modulators 102. Likewise, where each ΔΣ modulator output 112 is time shifted similar to its respective input 108, the digital representation of the analog input signal 114 is effectively updated at a rate of $Mf_s$ for M total ΔΣ modulators 102.

The multiplexer 104 comprises a MUX, switch or other device that performs an M to 1 switching of an N-bit digital word. The multiplexer 104 thus provides an N-bit multiplexer output 120 that represents the N-bit modulator output 112 of a select one of the plurality of ΔΣ modulators 102 at a given time. Preferably, the multiplexer output 120 is updated at a frequency of $Mf_s$ to reflect the value of the next successive one of the ΔΣ modulators 102, thus the N-bit multiplexer output 120 ($Y_1$) changes at a rate of $Mf_s$ to synchronously select each time interleaved ΔΣ modulator output 112. For example, as illustrated, the multiplexer input control 118 comprises one or more input selection control signal inputs of the multiplexer 104 that are preferably synchronized with the sample frequency clock signals 124–132 coupled to the ΔΣ modulator clock inputs 110.

Bandpass ΔΣ Architecture Using Bandpass Modulators

Figure 3:
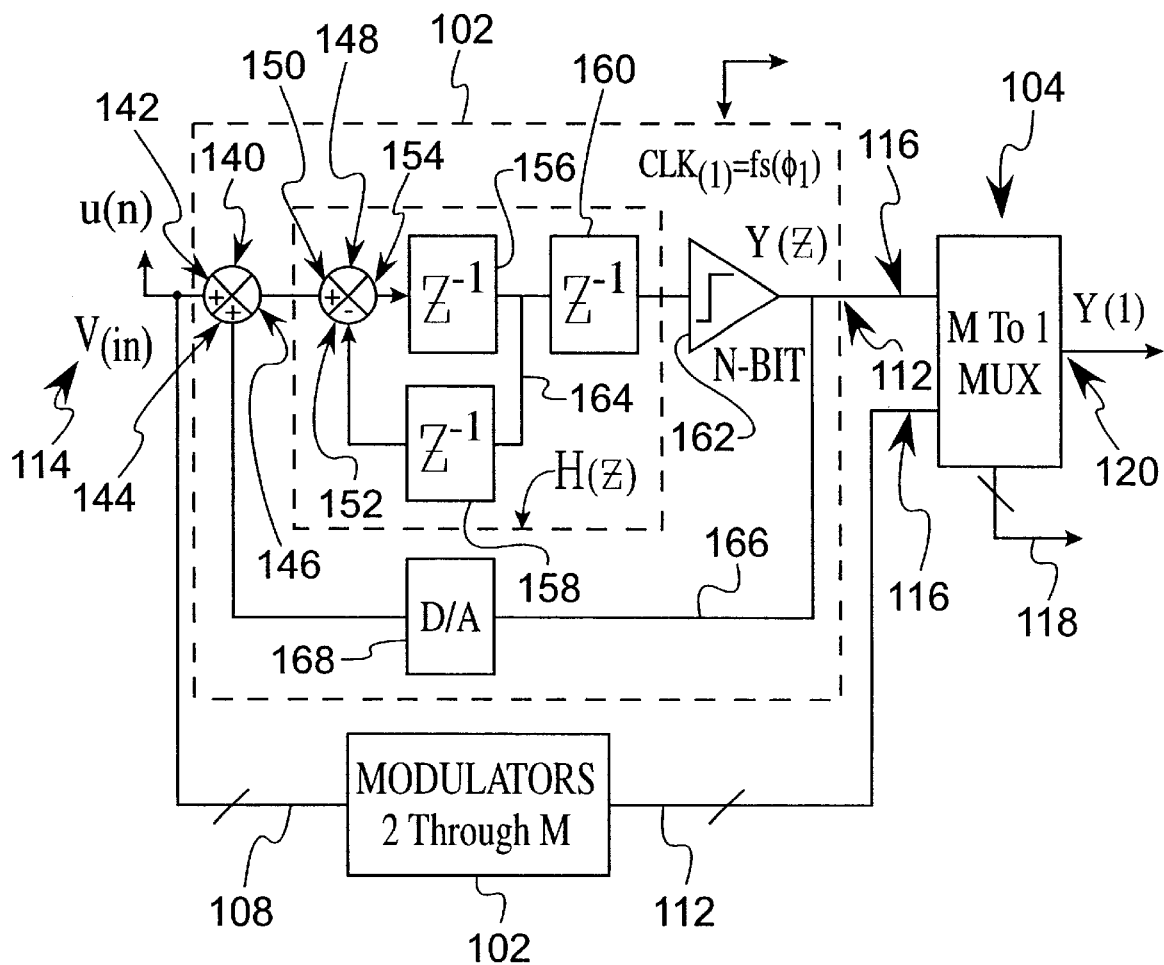
FIG. 3 is a schematic illustration of a portion of the circuit of FIG. 1, where each modulator is implemented as a first order band pass delta sigma modulator; and, FIG. 4 is a schematic illustration of a portion of the circuit of FIG. 1, where each modulator is implemented as a first order low pass delta sigma modulator.

Referring to FIG. 3 each ΔΣ modulator 102 may be implemented as a first order bandpass ΔΣ modulator. The ΔΣ modulator 102 comprises a first summing node 140 having first and second inputs 142, 144, and an output 146, a second summing node 148 having first and second inputs 150, 152 and an output 154, first, second, and third delay elements 156, 158, 160, a comparator or quantizer 162, a first feedback path 164, a second feedback path 166 and a digital to analog converter 168. The analog input signal $V_{in}$ 114 is coupled to the first input 142 of the first summing node 140. The output 146 of the first summing node 140 is coupled to the first input 150 of the second summing node 148. The output 154 of the second summing node 148 is coupled to the first delay element 156. The output of the first delay element 156 is coupled to the second delay element 158 via the first feedback path 164, and the output of the second delay element 158 is coupled to the second input 152 of the second summing node 148. As illustrated, the output of the second delay element 158 at the second input 152 of the second summing node 148 is subtracted from the input signal at the first input 150 of the second summing node 148 to provide the proper noise shaping function.

The output of the first delay element 156 is also coupled to the third delay element 160, and the output of the third delay element 160 is coupled to the quantizer 162. The quantizer 162 provides modulator output 112, which comprises an N-bit digital word Y(z). The modular output 112 is coupled to a select one of the multiplexer inputs 116. Additionally, the N-bit digital word output of the quantizer 162 is coupled via the second feedback path 166 to the digital to analog converter 168, and the analog version of the quantizer output is coupled to a second input 144 of the first summing node 140 such that the analog version of the quantizer output is added to the analog input signal 114 to provide the desired noise shaping characteristics. As illustrated, the bandpass ΔΣ modulator 102 implements the function $$H(z) = \frac{z^{-2}}{1+z^{-2}}.$$

For each ΔΣ modulator 102 or channel, the N-bit output of the quantizer 162 is expressed as the sum of a signal component ($S_{TF}$) and a quantization noise component ($N_{TF}$) and can be expressed by the formula:

$$Y(z) = S_{TF}u(z) + N_{TF}E(z)$$

$$\text{where}: S_{TF} = \frac{H(z)}{1-H(z)} \text{ and } N_{TF} = \frac{1}{1-H(z)}, \text{ thus}$$

$$S_{TF} = z^{-2} \text{ and } |N_{TF}| = |1+z^{-2}| = 2\cos\left(\frac{2\pi f}{f_s}\right)$$

The input signal is propagated with only a delay, and the quantization noise is attenuated at frequencies in the vicinity of fs/4. For linear system approximations, the quantization noise is approximated as additive random noise shaped by a notch filter characteristic of the noise transfer function. The actual noise is likely deterministic and dependent upon the input. However, linear approximations are sufficient to model the embodiments of the present invention described herein.

Referring back to FIG. 1, according to one embodiment of the present invention, the filter and other processing circuitry 106 comprises a bandpass filter. It will be observed that if a single, conventional, ΔΣ bandpass modulator output is coupled to the bandpass filter 106, and the bandpass center frequency is tuned to a frequency of $f_s/4$, then a signal with a bandwidth $f_\Delta$ will be passed, and the quantization noise is reduced by the noise shaping in the bandwidth of interest. The theoretical maximum in-band signal to noise ratio of the first order ΔΣ bandpass modulator output is given by:

$$S/N(db) = 6.02N - 6.42 + 30\log\left(\frac{f_s}{f_\Delta}\right)$$

where $f_\Delta$ is the bandwidth of the analog input signal centered at $f_c$. This expression assumes that the analog input signal 114 comprises a sine wave having an amplitude set to the maximum value ($V_{ref}$) and the quantization noise has a spectral density that is uniform over the frequency range $f_s$, but provides a convenient reference for comparison as will be explained more fully herein.

Approximately 6db of signal to noise ratio is achieved for each bit of resolution. Also, higher signal-to-noise ratios (higher resolution) is obtained by restricting the bandwidth $f_\Delta$ to small values relative to $f_s$. For a single channel of the bandpass ΔΣ modulator 102, the signal to noise ratio increases by the factor 30 log $$\left(\frac{f_s}{f_\Delta}\right)$$

where the ratio $$\left(\frac{f_s}{f_\Delta}\right)$$

is called the oversampling ratio. The larger the oversampling ratio, the larger the signal-to-noise ratio and the better the resolution.

However, the maximum in-band S/N ratio obtained by the parallel time interleaved ΔΣ modulator ADC 100 comprising M bandpass ΔΣ modulators 102 is:

$$S/N(db) = 6.02N - 6.42 + 30\log\left(\frac{f_s}{f_\Delta}\right) + 10 \log M$$

Thus the signal to noise ratio of the parallel time interleaved ΔΣ modulator ADC 100 is substantially the same as that defined above for a single channel of the bandpass ΔΣ modulator, except that the quantization noise at the output of the multiplexer is distributed over a frequency range of $Mf_s$. As such, the signal to noise ratio is increased by the ΔΣ modulation noise shaping $$\left(30 \log\left(\frac{f_s}{f_\Delta}\right)\right),$$

and the signal to noise ratio is further increased over a single bandpass ΔΣ modulator by the frequency spreading term 10logM.

It will be appreciated that the center frequency of the bandpass filter will depend upon the noise shaping function of the individual ΔΣ modulators 102. The noise shaping function for a single channel bandpass ΔΣ modulator has a value of zero at:

$$f_c = \frac{(2n-1)f_s}{4}$$

where n is an integer equal to or greater than zero. Limiting the range of center frequencies based upon the Nyquist theorem, the center frequency $f_c$ of the bandpass filter is preferably chosen as $$f_c < \frac{Mf_s}{2} \text{ or } f_c = \frac{f_s}{4}, \frac{3f_s}{4}, \frac{5f_s}{4} \ldots, \left(\frac{Mf_s}{2} - \frac{f_s}{4}\right)$$

in order to diminish the quantization noise by the noise shaping function of the individual bandpass ΔΣ modulators operating at a frequency of $f_s$.

Accordingly, the center frequency of the parallel time interleaved ΔΣ modulator ADC 100 according to FIGS. 1–3 can be extended to frequencies much higher than a single bandpass ΔΣ modulator operating at a frequency of $f_s$, which is limited to $f_s/4$, while obtaining the required S/N ratio for high resolution. The parallel time interleaved ΔΣ modulator ADC 100 uses M single channel ΔΣ modulators 102 in parallel to dramatically increase the range of bandpass center frequencies that can be used while retaining and improving the advantages of the ΔΣ noise shaping of the individual modulators.

As an example, assume the parallel time interleaved ΔΣ modulator ADC 100 comprises a total of 8 bandpass ΔΣ modulators 102 or channels, each having a 4 bit quantized modulator output 112, wherein the respective clock signal inputs 110 are coupled to time interleaved clock signals as described herein, with sampling frequency $f_s$=100MHz. The effective sampling frequency is $Mf_s$=800MHz. The multiplexer 104 comprises an 8-to-1 multiplexer having a 4 bit multiplexer output 120. The center frequency of the bandpass ADC is preferably selected to be any one of the following: $f_s/4$, $3f_s/4$, $5f_s/4$, $7f_s/4$, $9f_s/4$, $11f_s/4$, $13f_s/4$, or $15f_s/4$, that is, the center frequency for the 8 channel parallel architecture is preferably chosen to be one of 25 MHz, 75 MHz, 125 MHz, 175 MHz, 225 MHz, 275 MHz, 325 MHz and 375 MHz in the above example.

If each ΔΣ modulator comprises a bandwidth $f_\Delta$=1.6MHz, then the S/N ratio of the parallel time interleaved ΔΣ modulator ADC 100 is approximatey 80.5db (about 13 bits).

In comparison, for a conventional single channel bandpass ΔΣ modulator having a sampling frequency of 100Mhz and a bandwidth of 1.6Mhz as per the above example, the center frequency is restricted to $f_s/4$. Using a sampling frequency of 100 Mhz, the center frequency is limited to 25 MHZ. Also, using the above stated equation for the signal to noise ratio of a first order bandpass ΔΣ modulator, the conversational ΔΣ modulator has a S/N ratio of approximately 71.5 db (about 12 bits). This example clearly demonstrates that the present invention dramatically increases the range of possible center frequencies that can be obtained with individual ΔΣ modulators operating at relative low sample frequencies, $f_s$. This example further illustrates the improvement in signal to noise ratio introduced by the frequency spreading term 10logM.

The above discussion is based upon single order ΔΣ modulators. However, higher order ΔΣ modulators may also be used in the present invention. Certain advantages such as higher signal to noise ratio are realized by using such higher order ΔΣ modulators. For example, by replacing the ΔΣ modulators 102 schematically illustrated in FIG. 3 with second order ΔΣ modulators, the ΔΣ modulation noise shaping component of the signal to noise ratio increases to $$\left(50 \log\left(\frac{f_s}{f_\Delta}\right)\right).$$

Bandpass ΔΣ Architecture Using Lowpass Modulators

Figure 4:
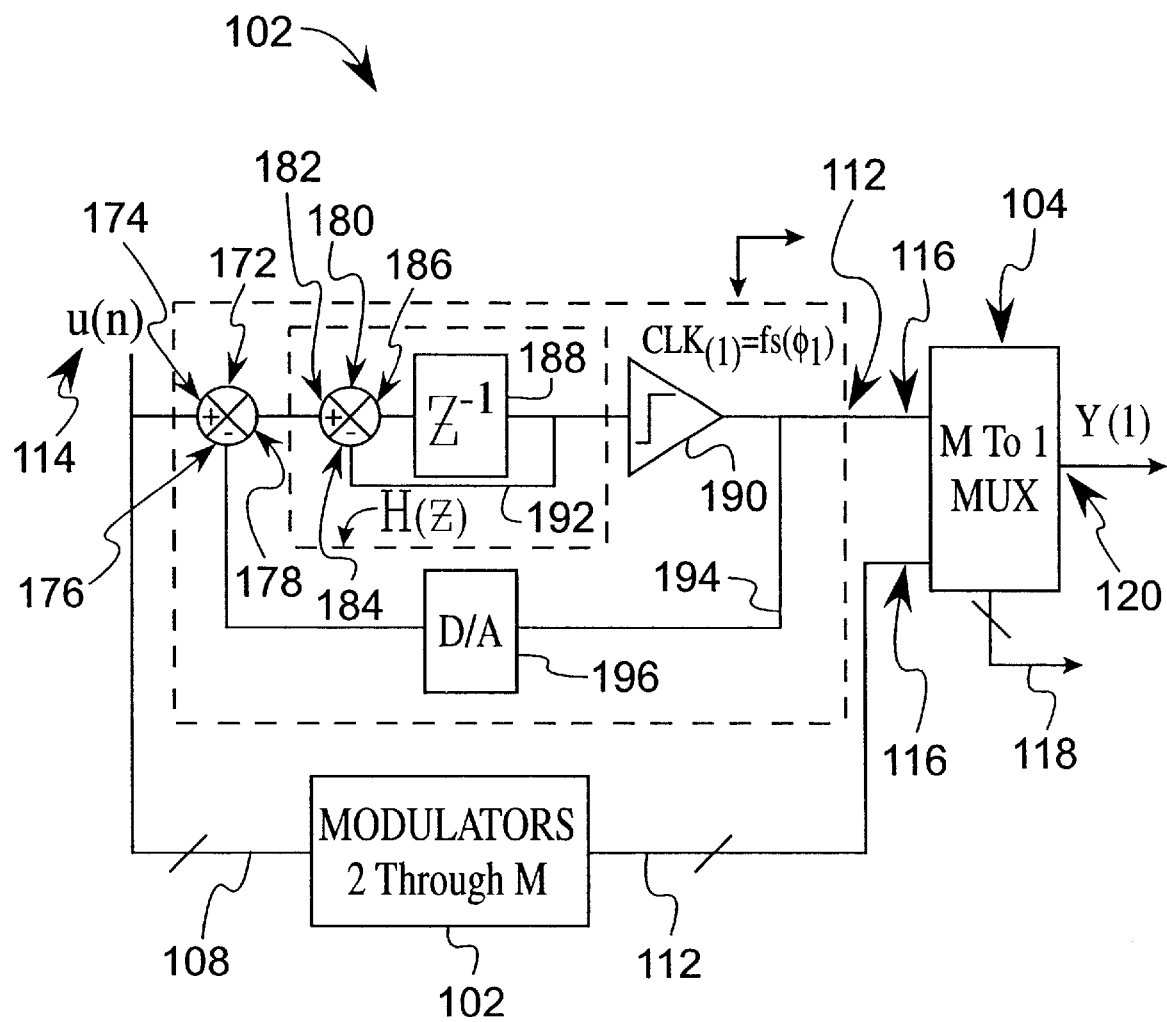

Referring to FIG. 4, each of the ΔΣ modulators 102 may also be implemented as a first order low pass ΔΣ modulator. Each lowpass ΔΣ modulator comprises a first summing node 172 having first and second inputs 174, 176 and an output 178, a second summing node 180 having first and second inputs 182, 184 and an output 186, a delay element 188, a comparator or quantizer 190, first and second feedback paths 192, 194, and a digital to analog converter 196. The analog input signal 114 u(n) is coupled to the first input 174 of the first summing node 172. The output 178 of the first summing node 172 is coupled to a first input 182 of the second summing node 180, and the output 186 of the second summing node 180 is coupled to the delay element 188.

The output of the delay element 188 is fed back via the first feedback path 192 and coupled to the second input 184 of the second summing node 180 such that the output of the delay element 188 is subtracted from the first input 182 to the second summing node 180. The output of the delay element 188 is also coupled to the quantizer 190. The output of the quantizer 190 defines the ΔΣ modulator output 112, and is also fed back via the second feedback path 194 and the digital to analog converter 196 to the second input 176 of the first summing node 172. The output of the quantizer 190 is subtracted from the analog input signal at the first summing node to keep the output bounded. As illustrated, the lowpass ΔΣ modulator 102 implements the function $$H(z) = \frac{1}{z-1}.$$

The quantizer output 112 comprises discrete comparator decisions represented by N-bits, where N comprises at least one bit. For example, for a one-bit quantizer 112, the comparator decision takes a value approximately equal to either the positive rail ($+V_{ref}$) or the negative rail ($-V_{ref}$) of the comparator supply voltages.

The quantizer output 112 is the sum of a signal component ($S_{TF}$) and a quantization noise component ($N_{TF}$) and can be expressed by the formula:

$$Y(z) = S_{TF}U(z) + N_{TF}E(z) \text{ where:}$$

$$S_{TF} = \frac{H(z)}{1+H(z)} \text{ and } N_{TF} = \frac{1}{1+H(z)} \text{ thus}$$

$$S_{TF} = z^{-1} \text{ and } N_{TF} = (1-z^{-1}) \text{ with } |N_{TF}| = 2\sin\frac{\pi f}{f_s}$$

The input signal is propagated with a delay, while the quantization noise is attenuated at low frequencies by the noise shaping of the discrete integrator. The integrator is schematically illustrated as the second summing node 180 coupled to the delay element 188 including the unity gain first feedback path 192 coupling the output of the delay element 188 back to the second input 184 of the second summing node 180.

The theoretical maximum in-band signal to noise ratio of each lowpass ΔΣ modulator is:

$$S/N(db) = 6.02N - 3.41 + 30\log\left(\frac{f_s}{2f_0}\right)$$

As with the bandpass ΔΣ modulator discussed above with reference to FIG. 3, this expression assumes that the analog input signal comprises a sine wave having an amplitude set to the maximum value ($V_{ref}$) and the quantization noise has a spectral density that is uniform over the frequency range $f_s$. N represents the number of bits of the quantizer output. For a one bit quantizer, N=1. The oversampling ratio is defined as:

$$OSR = \frac{f_s}{2f_0}$$

where $f_0$=the bandwidth of the input signal.

It will be appreciated that the lowpass ΔΣ modulator schematically illustrated in FIG. 4 comprises a first order lowpass ΔΣ modulator. However, the present invention may also be implemented with higher order lowpass ΔΣ modulators. Higher order ΔΣ modulators result in a quantization noise transfer function $N_{TF}=(1-z^{-1})^L$ where L is the order of the ΔΣ modulator. The magnitude of the $N_{TF}$ is given by $$|N_{TF}(f)| = \left[2\sin\frac{\pi f}{f_s}\right]^L.$$

Thus, higher order lowpass ΔΣ modulators yield an increased attenuation of the quantization noise at low frequencies.

Referring back to FIG. 1, assume that the filter 106 is implemented as a bandpass filter. The center frequency $f_c$ of the bandpass filter 106 depends upon the desired noise shaping functions of the individual ΔΣ modulators. The noise shaping function of the low pass ΔΣ modulators 102 have a magnitude of $$|N_{TF}| = 2\sin\frac{\pi f}{f_s}.$$

Thus the noise function has a value of zero at $$f_c = nf_s < \frac{Mf_s}{2}$$

where n is greater than or equal to zero, thus $$f_c = 0, f_s, 2f_s, \ldots \left(\frac{Mf_s}{2} - f_s\right).$$

It will be appreciated that a center frequency below the Nyquist frequency will result in the quantization noise being diminished by the noise shaping function of the ΔΣ modulators operating at a frequency of $f_s$.

The signal to noise ratio of the parallel time interleaved lowpass ΔΣ modulator ADC is:

$$S/N(db) = 6.02N - 3.41 + 30\log\left(\frac{f_s}{f_\Delta}\right) + 10\log M$$

where $f_\Delta$ is the bandwidth centered at frequency $f_c$. The lowpass modulators see an input signal that ranges in frequency from $$f_c - \frac{f_\Delta}{2}$$

to $$f_c + \frac{f_\Delta}{2}.$$

Thus the modulations are subsampling the input signals, and the quantized sampled data outputs of each modulator is a low frequency alias of the input. For example, if $f_s$=100 MHz and $f_c$=100 MHz, then an input signal of 102 Mhz would result in a 2 MHz quantitized sampled data output signal from each modulator. Similarily, a 98 MHz input signal would again result in a 2 MHz quantitized sampled data output, but would be phase reversed compared to the 102 MHz signal. With the multiple time interleaved channels, the sampled data output signal in the frequency range of $$f_c - \frac{f_\Delta}{2}$$

to $$f_c + \frac{f_\Delta}{2}$$

can be reconstructed by multiplexing the modulator outputs. Thus the noise shaping is like a notch filter centered at $F_c$ and the signal to noise ratio at the output of the bandpass filter is the same as that obtained for the bandpass modulator. This results in the signal to noise ratio increasing by approximately 6 db when compared to the signal low pass modulator with the same bandwidth. In addition, the signal to noise ratio is increased by 10logM over the signal low pass ΔΣ modulator design because the quantization noise at the output of the modulator is distrubuted over a frequency of $Mf_s$.

For example, assume each ΔΣ modulator comprises a lowpass ΔΣ modulator having a 4-bit quantizer output, and that the sample frequency $f_s$=100 MHz. If M=8 (there are a total of 8 lowpass ΔΣ modulators) then the effective sampling rate is 800 Mhz and the bandpass center frequency is preferably selected at any one of 100 MHz, 200 MHz or 300 MHz $$\left(f_c < \frac{Mf_s}{2}\right).$$

The output of the multiplexer 104 is updated at a frequency $Mf_s$=800 MHz. If the bandpass filter has a bandwidth $f_\Delta$=1.6 Hz, then the signal to noise ratio S/N =80.5 db (or 13 bits of resolution). If the bandwidth ($f_\Delta$) of the bandpass filter is decreased, the effective oversampling ratio ($f_s/2f_\Delta$) is increased, resulting in a higher S/N ratio.

Notably, again, the present invention dramatically increases the range of possible center frequencies that can be obtained with individual ΔΣ modulators operating at relative low sample frequencies, $f_s$. Further, signal to noise ratios are increased by the ΔΣ modulation noise shaping $$\left(30 \log\left(\frac{f_s}{f_\Delta}\right)\right)$$

and by the frequency spreading term (10 logM). Again by replacing the first order ΔΣ modulators 102 schematically represented in FIG. 4 with second order modulators, the signal to noise ratio increases by $$\left(50 \log\left(\frac{f_s}{f_\Delta}\right)\right).$$

Having described the invention in detail and by reference to preferred embodiments thereof, it will be apparent that modifications and variations are possible without departing from the scope of the invention defined in the appended claims.

What is claimed is:

1. A time interleaved delta sigma modulator analog to digital converter comprising:
  a multiplexer having a plurality of multiplexer inputs, a multiplexer output, and a multiplexer input control, said multiplexer input control arranged to couple a select one of said plurality of multiplexer inputs to said multiplexer output;
  a plurality of modulators, each of said plurality of modulators having a modulator input, a clock input, and a modulator output, wherein:
    each modulator input is coupled in parallel to an analog input signal;
    each clock input is coupled to a clock signal that operates at a predetermined sample frequency and is time phase shifted such that each of said plurality of modulators samples said analog input signal at a different time; and,
    each modulator output is coupled to a respective one of said plurality of multiplexer inputs; and,
  at least one control signal coupled to said multiplexer input control and arranged to select between said plurality of multiplexer inputs.

2. A time interleaved delta sigma modulator analog to digital converter according to claim 1, wherein said at least one control signal is arranged to select each one of said plurality of multiplexer inputs once every cycle of said predetermined sample frequency.

3. A time interleaved delta sigma modulator analog to digital converter according to claim 1, wherein said at least one control signal is synchronized with said clock signals coupled to said clock inputs of said plurality of modulators.

4. A time interleaved delta sigma modulator analog to digital converter according to claim 1, wherein each of said modulators comprise at least a first order bandpass delta sigma modulator.

5. A time interleaved delta sigma modulator analog to digital converter according to claim 4, wherein each modulator output is fed back and summed with said analog input signal appearing at said modulator input.

6. A time interleaved delta sigma modulator analog to digital converter according to claim 1, wherein each of said modulators comprise at least a first order lowpass delta sigma modulator.

7. A time interleaved delta sigma modulator analog to digital converter according to claim 6, wherein each modulator output is fed back and subtracted from said analog input signal appearing at said modulator input.

8. A time interleaved delta sigma modulator analog to digital converter according to claim 1, wherein said multiplexer output is coupled to a bandpass filter and a decimation circuit.

9. A time interleaved delta sigma modulator analog to digital converter according to claim 1, wherein each clock signal that is coupled to an associated clock input of said plurality of modulators is time phase shifted such that samples of said analog input signal appear at said modulator outputs in a time-interleaved manner.

10. A time interleaved delta sigma modulator analog to digital converter according to claim 1, wherein said multiplexer output is coupled to a bandpass filter having a center frequency less than a frequency defined by the product of said sample frequency and the quantity of said plurality of modulators divided by two.

11. A time interleaved delta sigma modulator analog to digital converter comprising:
  a multiplexer having a plurality of multiplexer inputs, a multiplexer output, and a multiplexer input control, said multiplexer input control arranged to couple a select one of said plurality of multiplexer inputs to said multiplexer output;
  a sample frequency clock operating at a predetermined sample frequency having a sample frequency period;

a plurality of modulators, each of said plurality of modulators having a modulator input, a clock input, and a modulator output, wherein:
  each modulator input is coupled in parallel to an analog input signal;
  each clock input is coupled to a clock signal that operates at said predetermined sample frequency and is time phase shifted such that each of said plurality of modulators samples said analog input signal once within said sample frequency period in a time interleaved manner; and,
  each modulator output is coupled to a respective one of said plurality of multiplexer inputs; and,
at least one control signal coupled to said multiplexer input control arranged to select each of said multiplexer inputs once within every sample frequency period.

12. A time interleaved delta sigma modulator analog to digital converter according to claim 11, wherein said at least one control signal is synchronized with said clock signals coupled to said clock inputs of said plurality of modulators.

13. A time interleaved delta sigma modulator analog to digital converter according to claim 11, wherein M defines the total quantity of said plurality of modulators and each clock input is successively time phase shifted by an amount equal to one divided by the product of M times said sample frequency.

14. A time interleaved delta sigma modulator analog to digital converter according to claim 11, wherein M defines the total quantity of said plurality of modulators, N defines the number of bits of resolution of each of said modulator outputs, and said multiplexer comprises an M-to-one multiplexer having M multiplexer inputs, each of said M multiplexer inputs comprising at least N bits of resolution, and said multiplexer output comprises at least N bits of resolution, wherein said at least one control signal cycles said multiplexer output between said M multiplexer inputs at a rate of M times said sample frequency.

15. A time interleaved delta sigma modulator analog to digital converter according to claim 11, wherein:
  M defines the total quantity of said plurality of modulators;
  m defines the $m^{th}$ one of M total ones of said plurality of modulators where m is a number between one and M;
  $f_s$ defines said predetermined sample frequency; and,
  each clock input is time phase shifted by an amount substantially equal to the expression $(m-1)/M\, f_s$.

16. A time interleaved delta sigma modulator analog to digital converter according to claim 15, wherein said analog input signal comprises an input voltage expressed $V_{in}$ and said input voltage is sampled by each of said plurality of modulators based upon the equation $$V_m = V_{in}\left(t - \frac{m-1}{Mf_s}\right),$$

where $V_m$ comprises the value of said input voltage at the time the $m^{th}$ one of said plurality of modulators takes a sample.

17. A time interleaved delta sigma modulator analog to digital converter according to claim 11, wherein said multiplexer output is coupled to a bandpass filter and a decimation circuit.

18. A time interleaved delta sigma modulator analog to digital converter according to claim 11, wherein each of said modulators comprise at least a first order bandpass delta sigma modulator.

19. A time interleaved delta sigma modulator analog to digital converter according to claim 18, wherein each modulator output is fed back and summed with said analog input signal appearing at said modulator input.

20. A time interleaved delta sigma modulator analog to digital converter according to claim 18, wherein said multiplexer output is coupled to a bandpass filter having a center frequency selected by the equation $$f_c = \frac{(2n-1)f_s}{4} < \frac{Mf_s}{2}$$

where:
  $f_c$ defines said bandpass filter center frequency;
  n comprises an integer greater than or equal to zero;
  $f_s$ defines said sample frequency; and
  M defines the quantity of said plurality of modulators.

21. A time interleaved delta sigma modulator analog to digital converter according to claim 11, wherein each of said modulators comprise a first order lowpass delta sigma modulator.

22. A time interleaved delta sigma modulator analog to digital converter according to claim 21, wherein each modulator output is fed back and subtracted from said analog input signal appearing at said modulator input.

23. A time interleaved delta sigma modulator analog to digital converter according to claim 21, wherein said multiplexer output is coupled to a bandpass filter having a center frequency selected by the equation $$f_c = nf_s < \frac{Mf_s}{2}$$

where:
  $f_c$ defines said bandpass filter center frequency;
  n comprises an integer greater than or equal to zero;
  $f_s$ defines said sample frequency; and
  M defines the quantity of said plurality of modulators.

24. A time interleaved delta sigma modulator analog to digital converter according to claim 11, wherein said multiplexer output is coupled to a bandpass filter having a center frequency less than a frequency defined by the product of said sample frequency and the quantity of said plurality of modulators divided by 2.

25. A time interleaved delta sigma modulator analog to digital converter according to claim 11, wherein said time interleaved delta sigma modulator analog to digital converter comprises a signal to noise ratio comparable to a single channel delta sigma modulator and further increased by at least the frequency spreading term 10 log M where M comprises the quantity of said plurality of modulators.

26. A time interleaved delta sigma modulator analog to digital converter comprising:
  a multiplexer having a plurality of multiplexer inputs, a multiplexer output, and a multiplexer input control, said multiplexer input control arranged to couple a select one of said plurality of multiplexer inputs to said multiplexer output;
  a plurality of modulators, each of said plurality of modulators having a modulator input, a clock input, and a modulator output, wherein:
    each modulator input is coupled in parallel to an analog input signal;
    each clock input is coupled to a clock signal that operates at a predetermined sample frequency and is time phase shifted such that each of said plurality of modulators samples said analog input signal at a different time; and, each modulator output is coupled to a respective one of said plurality of multiplexer inputs;

at least one control signal coupled to said multiplexer input control and arranged to select each one of said plurality of multiplexer inputs once every cycle of said predetermined sample frequency, wherein said at least one control signal is synchronized with said clock signals coupled to said clock inputs of said plurality of modulators; and, a bandpass filter coupled to said multiplexer output having a center frequency less than a frequency defined by the product of said sample frequency and the quantity of said plurality of modulators divided by two.

* * * * *

UNITED STATES PATENT AND TRADEMARK OFFICE
CERTIFICATE OF CORRECTION

PATENT NO.   : 6,518,905 B2
DATED        : February 11, 2003
INVENTOR(S)  : Raymond E. Siferd It is certified that error appears in the above-identified patent and that said Letters Patent is hereby corrected as shown below:

Column 1,
Line 20, reads as "and in is particular", should read -- and in particular --.
Line 34, reads as "converters (ADCS)", should read -- converters (ADCs) --.

Column 4,
Line 7, reads as "120,or" should read -- 120, or --.

Column 8,
Line 26, reads as "conversational" should read -- conventional --.

Column 10,
Line 57, reads as "the modulations are" should read -- the modulators are --.

Column 11,
Line 17, reads as "over the signal" should read -- over the single --.
Line 34, reads as "1.6Hz" should read -- 1.6 MHz --.
Line 37, reads as "(f$_s$/2f$_\Delta$)" should read -- (f$_s$/f$_\Delta$) --.

Signed and Sealed this

Second Day of September, 2003

JAMES E. ROGAN
*Director of the United States Patent and Trademark Office*